US008258870B2

(12) United States Patent
Moses et al.

(10) Patent No.: US 8,258,870 B2
(45) Date of Patent: Sep. 4, 2012

(54) SYSTEM AND METHOD FOR DIGITAL CONTROL OF AMPLIFIER GAIN WITH REDUCED ZIPPER NOISE

(75) Inventors: Robert W. Moses, Vashon Island, WA (US); Christopher M. Hanna, Arlington, MA (US)

(73) Assignee: THAT Corporation, Milford, MA (US)

( * ) Notice: Subject to any disclaimer, the term of this patent is extended or adjusted under 35 U.S.C. 154(b) by 0 days.

(21) Appl. No.: 12/857,246

(22) Filed: Aug. 16, 2010

(65) Prior Publication Data

US 2011/0063034 A1  Mar. 17, 2011

Related U.S. Application Data

(60) Provisional application No. 61/234,046, filed on Aug. 14, 2009.

(51) Int. Cl.
*H03G 3/20* (2006.01)

(52) U.S. Cl. .................. 330/278; 330/279; 330/137

(58) Field of Classification Search .......... 330/278–279, 330/127, 137
See application file for complete search history.

(56) References Cited

U.S. PATENT DOCUMENTS

| 7,880,542 B1* | 2/2011 | Gilbert et al. ........... 330/127 |
| 2006/0017507 A1* | 1/2006 | Nodake ............... 330/279 |

* cited by examiner

*Primary Examiner* — Hieu Nguyen
(74) *Attorney, Agent, or Firm* — McDermott Will & Emery LLP

(57) ABSTRACT

A digitally-controlled analog gain circuit supports at plurality of gain settings in which gain changes are made from a first setting to a new setting in response to a clocking signal of a non-uniform rate. The non-uniform rate clocking signal can be created pseudo randomly by applying a periodic sequence of clock pulses to a linear feedback shift register. Alternatively, the non-uniform rate clock signal can be created by applying a noise source to a phase detector input of a phase locked loop. The clocking signal can be generated by an oscillator, or as a sequence of pulses output by a zero crossing detector. Finally, the gain circuit can apply positive gain to the signal. Alternatively, the gain circuit can apply a negative gain (attenuation) to the signal.

20 Claims, 3 Drawing Sheets

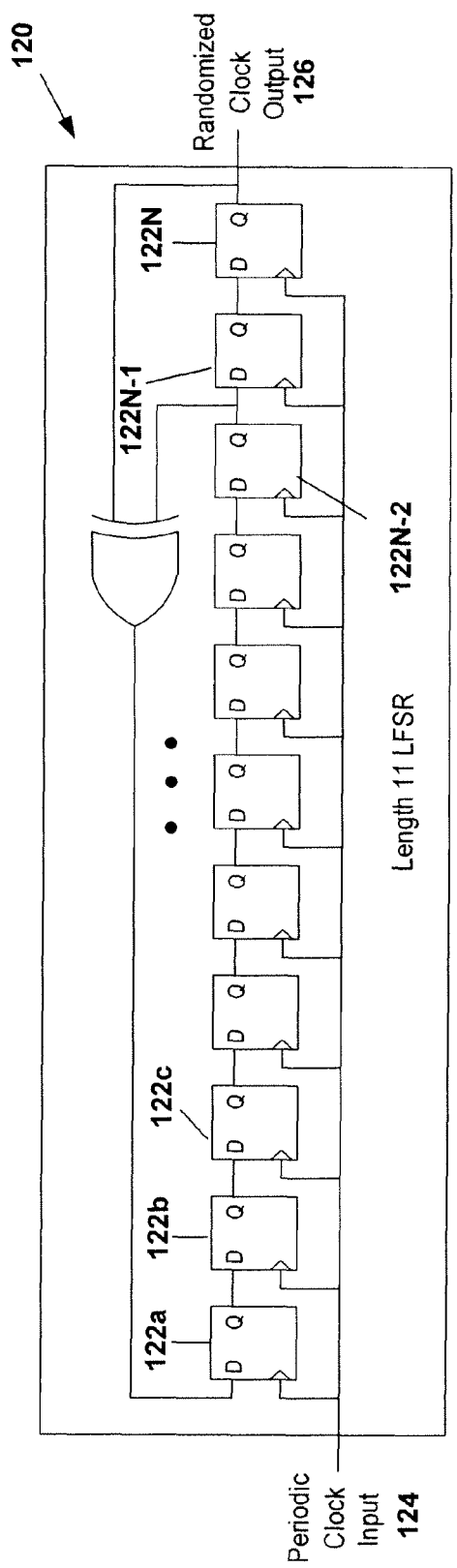

SYSTEM AND METHOD FOR DIGITAL CONTROL OF AMPLIFIER GAIN WITH REDUCED ZIPPER NOISE

CROSS-REFERENCE TO RELATED APPLICATIONS

This application is based upon and claims priority to U.S. provisional patent application No. 61/234,046, entitled "System and Method for Digital Control of Amplifier Gain with Reduced Zipper Noise," filed Aug. 14, 2009.

This application is also related to U.S. patent application Ser. No. 12/857,163, entitled "System and Method for Interpolating Digitally-Controlled Amplifier Gain," filed contemporaneously with the present application by the same inventors, and claiming priority from co-pending provisional application No. 61/234,056, entitled "System and Method for Interpolating Digitally-Controlled Amplifier Gain," by the same inventors, filed Aug. 14, 2009, and assigned to the current assignee, (hereinafter the "Companion Applications"); and U.S. patent application Ser. No. 12/857,099, contemporaneously filed with the present application in the name of Gary K Hebert, entitled Area Efficient, Programmable-Gain Amplifier and assigned to the present assignee, and claiming priority from U.S. Provisional Application Ser. No. 61/234,031 filed Aug. 14, 2009 in the name of Gary K. Hebert and entitled Area Efficient Programmable-Gain Amplifier, and assigned to the present assignee, (hereinafter the "Co-pending Applications"). The entire content of these applications is incorporated herein by reference.

BACKGROUND

1. Field

This disclosure describes a system and method for reducing the audibility of "zipper noise" inherent in digitally controlled analog gain applications.

2. Overview

The term "zipper noise" refers to the audible noise that results as a series of near-instantaneous gain changes are made to an analog signal, taking the gain through a range of values. Each near-instantaneous gain step causes a discontinuity in the analog signal. The discontinuity can take many forms, including the step-function discontinuity of the signal itself as the gain is suddenly changed from one level to another, as well as the small glitch added to the signal due to charge injection in FET-based switches. Both these forms can be exacerbated by overshoot and/or ringing in the analog circuitry. If these discontinuities are periodic, e.g. when gain is systematically "ramped" from one value to another, the periodic sequence sounds like a buzz or a zipper. This buzzing zipper sound is unacceptable in high quality audio circuits.

3. Description of Related Art

Texas Instruments PGA2500 Programmable Gain Amplifier and Cirrus Logic CS3310 Stereo Digital Volume Control, are digital control circuits that execute changes to an analog gain control circuit. Control software in a host microcontroller typically interpolates small gain steps (e.g., 1 dB) between large gain setting changes (e.g., 40 dB) by sending a sequence of periodic gain change commands so that the gain changes occur in accordance with a step function of sequential small gain steps until it reaches the large gain setting. Thus, for example, where the desired large gain change is 40 dB, the gain increases by 40 dB in sequential, fixed periodic steps of 1 dB each. This sequence of commands is typically executed in an iterative software loop or timer-based interrupt service routine at a constant periodic rate. The audio output resulting from such gain changes can be perceived by the listener as zipper noise.

One prior art attempt employed to reduce zipper noise is to make each sequential gain change only at successful zero crossings of the affected analog signal. By restricting the incremental gain changes to each zero crossing, the discontinuity in the analog voltage signal waveform output is minimized. Theoretically, no step function is added to the signal if gain is changed precisely at zero-crossings of the signal, but the discontinuity in the slope of the waveform may still be audible. This technique does not, however, reduce charge injection in FET-based switches commonly employed in these circuits. Moreover, it is impossible to restrict a gain change to perfectly match a zero crossing due to hysteresis and errors inherent in zero crossing detectors used to detect the zero crossings.

Another prior art technique to reduce zipper noise is to very slowly ramp the successive gain settings over a range of values. If the ramp is slow enough, e.g. 250 ms between each gain step, the series of glitches will not sound like a buzz, but will sound like a series of individual static "pops" in the background noise. However, this has the disadvantage of requiring a very long time to make significant changes in gain. For example, ramping from 20 dB to 60 dB gain in 1 dB steps every 250 ms between each step requires ten seconds for the gain change to take effect. This is clearly undesirable, particularly when providing audio programming with a relatively large dynamic range.

SUMMARY

In accordance with one aspect of the disclosure, a system is provided for digitally controlling the gain of an amplifier. The system comprises:

an amplifier configured to amplify an analog input signal in accordance with a gain represented by a digital gain control signal applied to the system; and a clock configured to generate a clocking signal so that the gain can be set in increments of gain change in response to a change in the gain represented by a respective change in the digital gain control signal;

wherein the increments of gain change are provided in non-uniform time increments.

In accordance with another aspect of the disclosure, a method of digitally controlling the gain of an amplifier comprises:

amplifying an analog input signal in accordance with a gain represented by a digital gain control signal; and generating a clocking signal so that the gain can be set in increments of gain change in response to a change in the gain represented by a respective change in the digital gain control signal;

wherein the increments of gain change are provided in non-uniform time increments.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings disclose illustrative embodiments. They do not set forth all embodiments. Other embodiments may be used in addition or instead. Details which may be apparent or unnecessary may be omitted to save space or for more effective illustration. Conversely, some embodiments may be practiced without all of the details which are disclosed. When the same numeral appears in different drawings, it refers to the same or like components or steps.

FIG. 2 shows one embodiment of a clock randomizer including a linear feedback shift register (LFSR) useful in proving a pseudo-random clock signal for the FIG. 1 embodiment;

FIG. 3 shows an alternative embodiment of a clock randomizer using a noisy phase locked loop.

DETAILED DESCRIPTION OF ILLUSTRATIVE EMBODIMENTS

Illustrative embodiments are now discussed. Other embodiments may be used in addition or instead. Details which may be apparent or unnecessary may be omitted to save space or for a more effective presentation. Conversely, some embodiments may be practiced without all of the details which are disclosed.

The following are illustrative embodiments designed to reduce the audibility of zipper noise by randomizing the timing of the discontinuities, turning them into a short term noise burst rather than a short term buzz. The human ear is less sensitive to random noise than it is to a periodic signal, thus, the disclosed system and method reduces the audibility of the zipper noise by changing the gain in incremental steps by randomizing the timing of the discontinuities.

Figure 1:
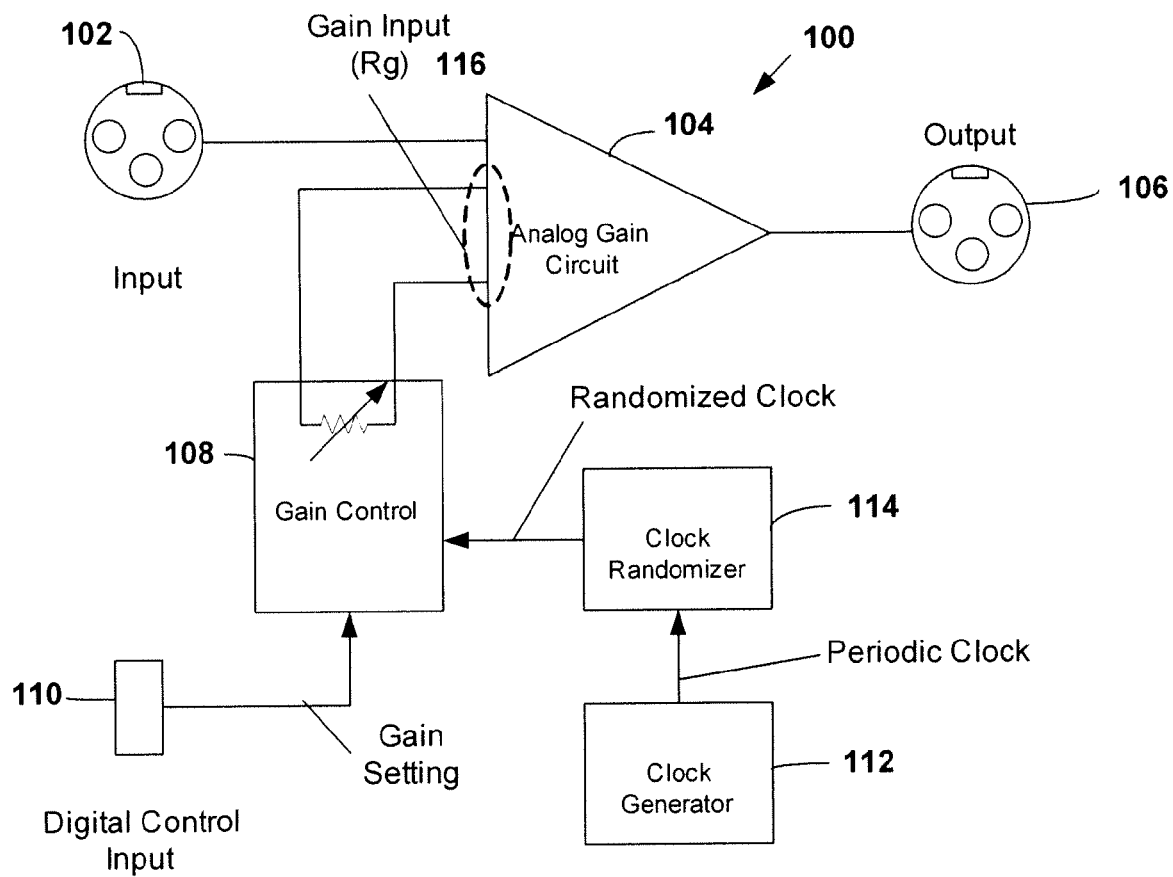
FIG. 1 is a block diagram of one embodiment of a system for digitally controlling amplifier gain with reduced zipper noise.

Referring to FIG. 1, a gain control system 100 is a block diagram of one embodiment of a system that is configured to reduce the audibility of zipper noise. The gain control system 100 includes an analog input 102 that receives the analog audio signal that is to be processed by the system 100. The input 102 is applied to the input of a gain control circuit 104, which in turn provides an output signal at the output 106 as function of the input signal and the gain setting of the analog gain circuit 104. The gain of analog circuit 104 is set as a function of the gain control signal provided from the gain controller 108 to the circuit 104. The latter receives a signal from the digital signal at control input 110, with controller 108 setting the gain of the analog gain circuit 104 as a function of the digital signal received from the digital control input 110. The gain is applied to the input signal so that the programmed gain change is implemented in incremental steps. Instead of implementing the gain changes in periodic increments, a clock generator 112 provides a clocking signal to a clock randomizer circuit 114 constructed to apply the clocking signal to the gain control means in a non-periodic or non-uniform manner so that the incremental gain changes applied to the input signal by the analog gain circuit are applied in a randomized or pseudo-random time varying sequence.

System 100 operates as follows: An analog input signal is applied to input 102 of analog gain circuit 104. Analog gain circuit 104 applies gain to the input signal according to the gain input set by the gain setting provided at the digital control input 110. One technique of changing the gain of the analog gain circuit 104 is to set the gain as a function of the input impedance (shown at 116 in FIG. 1)

In one embodiment gain controller 108 includes a network of resistors and FET switches, such as the one described in Co-pending Application. This network of resistors and FET switches provides a stepped variable resistance, Rg, to the Analog Gain Circuit 104 so that the gain setting of the analog gain circuit 104 can be any one of a plurality of discrete gain settings which is determined by the digital control signal applied to the digital control input 110. While the embodiment of FIG. 1 is illustrated as a circuit that provides positive gain, other embodiments may apply to circuits which also provide negative gain, e.g. a stepped attenuator such as the Cirrus CS3310.

Digital control input 110 is used to select the gain setting of the Gain Controller 108. This input is typically a Serial Peripheral Interface (SPI) control port or Inter-Integrated Circuit (I2C) control port, compatible with most microcontrollers.

Clock generator 112 can be any type designed to provide the periodic clocking rate of interest, and can include for example, an oscillator that outputs a clocking signal in the form of a square wave signal. The edges of this clock signal cause the digital logic to change state and move through its sequence of operations to change the gain from one discrete value to another.

Clock randomizer 114 is configured to convert the periodic clock received from clock generator 112 to a non-uniform clocking signal, thereby randomizing the rate of the gain changes made by Gain Controller 108.

For example, one embodiment of the clock randomizer, shown in greater detail at 120 in FIG. 2, can include a linear feedback shift register (LFSR) including a plurality of registers 122, configured so as to "throw away" clock pulses in a periodic pulse stream, applied at the input 124 of the (FIG. 2) so that the output at 126 appears as a pseudo-random clock output. An LFSR is a shift register whose input bit is a function of its previous state. By carefully selecting the taps taken from the shift register, applying them to an exclusive OR function (provided by XOR gate 128, and feeding the output of the XOR gate 128 to the input 124 of the shift register, the LFSR can generate a long sequence of bits that appear. If the transitions from a 0 to 1 (or 1 to 0) are used as clock edges, this pseudo-random sequence will function as a "random clock". The advantage of this approach is that the periodic pulse stream "reference clock" can be generated by any clock source in the system (e.g. synchronous to other system clocks in order to minimize "beating" in the system noise floor), or it can even be a series of pulses from a zero crossing detector.

In a typical gain change event, the gain controller 108 has an initial setting (for example, 20 dB). A new gain setting is provided at the digital control input 110, causing digital logic in controller 108 to step through a sequence of intermediate values on their way to the new gain setting (e.g., 1 dB steps toward a new value of 60 dB). Each of these intermediate gain steps is executed on the rising or falling edge of the clock signal output by the clock randomizer 114. Therefore, the gain changes are made at a non-uniform rate, and the signal discontinuities sound more like a small short term noise burst than a buzz.

FIG. 3 shows alternative embodiment of a clock randomizer 138 including a noisy phase locked loop. In FIG. 3, the periodic clock input 140 to the PLL 138 is applied to one input of the phase detector 142. The output of the detector 142 is applied to a loop filter 144. The output of the latter is applied to a signal summer 146, which adds to the signal from loop filter 144 a noisy signal received from the noise source 148. The summed signal is then applied to a voltage controlled oscillator (VCO) 150, which in turn provides an output 152. The output is provided in a feedback path to a frequency divider 154, which in turn provides its output to the second input of the phase detector 142. In a typical phase locked loop (PLL) configuration, the PLL provides an output clock signal that tracks the input clock signal. Adding noise to the input of the voltage-controlled oscillator (VCO) 150 induces jitter (randomization) to the output clock signal, and therefore makes the clocking signal more random. Since the timing of the edges of the output clock signal determines when gain changes occur, the jittery clock output at 152 causes the gain changes to occur at randomly varying times. This approach has the advantage that the clock can sweep continuously through a range instead of making the discrete steps inherent in the embodiment of FIG. 2, although this approach is of greater complexity.

Figure 4:
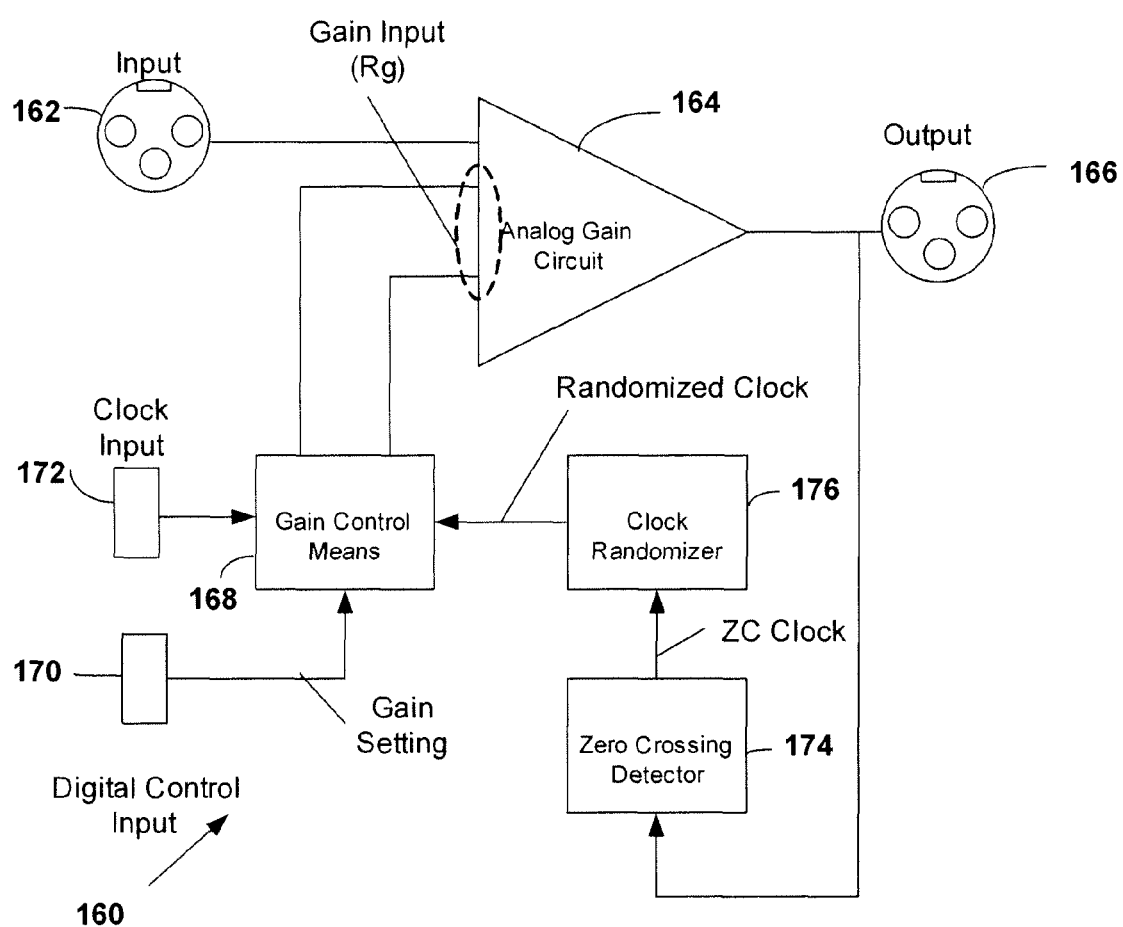
FIG. 4 shows an embodiment of a clock generator using a zero crossing detector.

In yet another embodiment, the clock generator (112 in FIG. 1) can be replaced with a zero crossing detector 174 to restrict gain changes to some (but not all) of the signal zero crossings, as shown in FIG. 4. The zero crossing detector 174 provides an output in the form of a series of pulses, each corresponding to when the audio signal output at 166 is near zero. These pulses are then randomized by the clock randomizer 176 so that only some of the pulses are subsequently used to clock gain control 168. In this embodiment the clock randomizer 176 is configured to apply the clock signal pseudo-randomly. For example randomizer 176 can include a LFSR, such as the one shown in FIG. 2, or the phase lock loop arrangement shown in FIG. 3.

By ensuring that gain updates are only made at some of the zero crossings, glitch energy due to step discontinuities is minimized. The clock randomizer 176 ensures that any residual glitch energy due to imperfections in zero crossing detector 174, or charge injection glitches from FET-based switches, are randomized and converted to innocuous noise rather than zipper noise.

The components, steps, features, objects, benefits and advantages which have been discussed are merely illustrative. None of them, nor the discussions relating to them, are intended to limit the scope of protection in any way. Numerous other embodiments are also contemplated. These include embodiments which have fewer, additional, and/or different components, steps, features, objects, benefits and advantages. These also include embodiments in which the components and/or steps are arranged and/or ordered differently.

Unless otherwise stated, all measurements, values, ratings, positions, magnitudes, sizes, and other specifications which are set forth in this specification, including in the claims which follow, are approximate, not exact. They are intended to have a reasonable range which is consistent with the functions to which they relate and with what is customary in the art to which they pertain.

All articles, patents, patent applications, and other publications which have been cited in this disclosure are hereby incorporated herein by reference.

The phrase "means for" when used in a claim is intended to and should be interpreted to embrace the corresponding structures and materials which have been described and their equivalents. Similarly, the phrase "step for" when used in a claim is intended to and should be interpreted to embrace the corresponding acts which have been described and their equivalents. The absence of these phrases in a claim mean that the claim is not intended to and should not be interpreted to be limited to any of the corresponding structures, materials, or acts or to their equivalents.

Nothing which has been stated or illustrated is intended or should be interpreted to cause a dedication of any component, step, feature, object, benefit, advantage, or equivalent to the public, regardless of whether it is recited in the claims.

The scope of protection is limited solely by the claims which now follow. That scope is intended and should be interpreted to be as broad as is consistent with the ordinary meaning of the language which is used in the claims when interpreted in light of this specification and the prosecution history which follows and to encompass all structural and functional equivalents.

The invention claimed is:

1. A digitally controlled gain control system for digitally controlling the gain of an amplifier, comprising:
    an amplifier configured to amplify an analog input signal in accordance with a gain represented by a digital gain control signal applied to the system; and
    a clock configured to generate a clocking signal so that the gain can be set in increments of gain change in response to a change in the gain represented by a respective change in the digital gain control signal;
    wherein the increments of gain change are provided in non-uniform time increments, wherein the clock includes a clock generator configured to generate a periodic clock signal and a clock randomizer configured to generate a pseudo-randomized clock signal in response to the periodic clock signal.

2. A system according to claim 1, wherein the amplifier supports a plurality of discrete gain settings.

3. A system according to claim 1, wherein the clock includes a clock signal randomizer configured so that clocking signal is generated in non-uniform time increments that vary pseudo-randomly.

4. A system according to claim 1, wherein the clock randomizer includes a linear feedback shift register (LFSR).

5. A system according to claim 1, wherein the clock randomizer includes a phase lock loop.

6. A system according to claim 5, wherein the phase lock loop includes a signal summer for adding noise into the phase lock loop.

7. A system according to claim 6, wherein the phase lock loop includes a voltage controlled oscillator.

8. A system according to claim 1, wherein the clock randomizer includes a zero crossing detector configured to provide a signal to the clock randomizer in response to detection of the analog signal being zero.

9. A system according to claim 1, wherein the system applies positive gain to the analog signal.

10. A system according to claim 1, wherein the system applies negative gain to the analog signal.

11. A method of digitally controlling the gain of an amplifier, comprising:
    amplifying an analog input signal in accordance with a gain represented by a digital gain control signal; and
    generating a clocking signal so that the gain can be set in increments of gain change in response to a change in the gain represented by a respective change in the digital gain control signal;
    wherein the increments of gain change are provided in non-uniform time increments; and
    wherein generating a clocking signal comprises generating a periodic clock signal and generating a pseudo-randomized clock signal in response to the periodic clock signal.

12. A method according to claim 11, wherein the amplifier supports a plurality of discrete gain settings each presented by a different digital gain control signal.

13. A method according to claim 11, wherein generating the clocking signal includes generating the clocking signal in non-uniform time increments that vary pseudo-randomly.

14. A method according to claim 11, wherein generating a pseudo-randomized clock signal includes processing the periodic clock signal with a linear feedback shift register (LFSR).

15. A method according to claim 11, wherein generating a randomized clock signal includes processing the periodic clock signal with a phase lock loop.

16. A method according to claim 15, wherein processing the periodic clock signal with a phase lock loop includes processing the periodic clock signal with a signal summer for adding noise into a signal path of the phase lock loop.

17. A method according to claim 15, wherein processing the periodic clock signal with a phase lock loop includes processing the periodic clock signal with a voltage controlled oscillator.

18. A method according to claim 11, wherein generating a clocking signal so that the gain can be set in increments of gain change in response to a change in the gain represented by a respective change in the digital gain control signal includes generating the clocking signal in response to detection of the analog signal crossing zero.

19. A method according to claim 11, wherein the method applies positive gain to the analog signal.

20. A method according to claim 11, wherein the method applies negative gain to the analog signal.

* * * * *